(12) United States Patent
Taniguchi et al.

(10) Patent No.: US 11,768,234 B2
(45) Date of Patent: Sep. 26, 2023

(54) INSULATION INSPECTING DEVICE

(71) Applicants: Panasonic Holdings Corporation, Osaka (JP); TOYOTA JIDOSHA KABUSHIKI KAISHA, Aichi-ken (JP)

(72) Inventors: Yasushi Taniguchi, Osaka (JP); Haruhisa Yagi, Osaka (JP); Noriyuki Maruyama, Toyota (JP); Noriaki Yamamoto, Toyota (JP); Takahiro Kuhara, Toyota (JP)

(73) Assignees: PANASONIC HOLDINGS CORPORATION, Osaka (JP); TOYOTA JIDOSHA KABUSHIKI KAISHA, Aichi (JP)

( * ) Notice: Subject to any disclaimer, the term of this patent is extended or adjusted under 35 U.S.C. 154(b) by 0 days.

(21) Appl. No.: 17/915,451

(22) PCT Filed: Mar. 25, 2021

(86) PCT No.: PCT/JP2021/012560
§ 371 (c)(1),
(2) Date: Sep. 28, 2022

(87) PCT Pub. No.: WO2021/200547
PCT Pub. Date: Oct. 7, 2021

(65) Prior Publication Data
US 2023/0142533 A1   May 11, 2023

(30) Foreign Application Priority Data
Mar. 31, 2020  (JP) ................. 2020-062805

(51) Int. Cl.
*H01H 31/12* (2006.01)
*G01R 31/16* (2006.01)
*G01R 31/12* (2020.01)

(52) U.S. Cl.
CPC ......... *G01R 31/16* (2013.01); *G01R 31/1263* (2013.01)

(58) Field of Classification Search
CPC ........ G01R 31/12; G01R 31/14; G01R 31/16; G01R 31/1263; G01R 31/1218;
(Continued)

(56) References Cited

U.S. PATENT DOCUMENTS 6,311,025 B1 * 10/2001 Nagata ............... G03G 15/0863
399/13
2010/0181871 A1 * 7/2010 Daniel ................. H10N 30/306
73/579
(Continued)

FOREIGN PATENT DOCUMENTS

JP     2009-170134 A     7/2009

OTHER PUBLICATIONS

International Search Report issued in corresponding International Application No. PCT/JP2021/012560, dated Jun. 8, 2021, with English translation.

*Primary Examiner* — Thang X Le
(74) *Attorney, Agent, or Firm* — McDermott Will & Emery LLP

(57) ABSTRACT

An insulation inspection device includes: a conveyance unit that conveys a laminated electrode in which a first separator, a first electrode plate, a second separator, and a second electrode plate are laminated; a pressure roll that presses the laminated electrode against the conveyance unit; a first terminal electrically connected to the first electrode plate; a second terminal electrically connected to the second electrode plate, further electrically connected to the conveyance unit when the first separator is disposed on the conveyance unit side, and further electrically connected to the pressure roll when the first separator is disposed on the pressure roll side; and an insulation inspection unit that applies a voltage (Continued)

to the laminated electrode to inspect insulation condition of the laminated electrode.

5 Claims, 7 Drawing Sheets

(58) Field of Classification Search
CPC .. G01R 31/129; G01R 31/1227; G01R 31/52; G01R 19/16566
See application file for complete search history.

(56) References Cited

U.S. PATENT DOCUMENTS

2017/0020413 A1\* 1/2017 Otaka ...................... G01B 7/22
2020/0400747 A1\* 12/2020 Min .......................... G01R 1/04

\* cited by examiner

FIG. 4

| NUMBER OF PRESSURE ROLLS | START OF INSPECTION (START OF CURRENT CONDUCTION) | START OF PRESSURIZATION (COMPLETION OF CHARGING) | DURING INSPECTION | END OF PRESSURIZATION (STOP OF CURRENT CONDUCTION) | END OF INSPECTION (COMPLETION OF DISCHARGE) | REQUIRED ROTATION ANGLE |
|---|---|---|---|---|---|---|
| 1 | −4° | | | | +90° | 94° |
| 2 | +12° | | | | +74° | 62° |
| 3 | +22° | | | | +63° | 41° |

INSULATION INSPECTING DEVICE

CROSS-REFERENCE TO RELATED APPLICATIONS

This application is the U.S. National Phase under 35 U.S.C. § 371 of International Patent Application No. PCT/JP2021/012560, filed on Mar. 25, 2021, which in turn claims the benefit of Japanese Patent Application No. 2020-062805, filed on Mar. 31, 2020, the entire content of each of which is incorporated herein by reference.

BACKGROUND

Field of the Invention

The present disclosure relates to an insulation inspection device.

Description of the Related Art

As batteries for automotive use or other applications, laminate-type batteries have been developed. Such a battery has a structure in which a container contains a laminated electrode group, in which multiple positive electrode plates and multiple negative electrode plates are alternately laminated with a separator in between, and also contains an electrolyte. To form a laminated electrode group, there is a method of forming, as a constituent unit of a laminated electrode group, a laminated electrode in which two electrode plates and two separators are alternately laminated, and sequentially laminating multiple laminated electrodes to complete a laminated electrode group. When forming a laminated electrode group by such a method, it is desirable to inspect the insulation of each laminated electrode before laminating it.

With regard to insulation inspection of laminated electrodes, Patent Literature 1, for example, discloses a method of laminating a positive electrode sheet and a negative electrode sheet via a separator sheet to form a sheet-like electrode laminate and applying a voltage between a pair of electrode rolls that sandwich the sheet-like electrode laminate, so as to measure the electric resistance value of the sheet-like electrode laminate.

Patent Literature 1: Japanese Unexamined Patent Application Publication No. 2009-170134

In the abovementioned conventional insulation inspection, a laminated electrode is provided between a pair of electrode rolls. Accordingly, insulation defects in the laminated electrode can be detected only when an insulation defect has occurred due to holes in both separators or when foreign matter mixed in an electrode plate is large enough to penetrate the two separators. In other words, it is difficult to detect insulation defects in the laminated electrode when an insulation defect has occurred only in one of the separators or when conductive foreign matter mixed in an electrode plate is small. Thus, there has been room for improving the performance of insulation inspection. Even if the foreign matter is too small to penetrate the two separators, it may be eluted in the electrolyte and may deposit on the electrode surface to grow in dendrite form, which may cause a short circuit. Therefore, it is desirable to also detect such small foreign matter as an insulation defect.

SUMMARY OF THE INVENTION

The present disclosure has been made in view of such a situation, and a purpose thereof is to provide a technology for improving the performance of insulation inspection for laminated electrodes.

One aspect of the present disclosure relates to an insulation inspection device. The device includes: a conveyance unit that conveys a laminated electrode in which a first separator, a first electrode plate, a second separator, and a second electrode plate are laminated in this order; a pressure roll that presses the laminated electrode against the conveyance unit; a first terminal electrically connected to the first electrode plate; a second terminal electrically connected to the second electrode plate, further electrically connected to the conveyance unit when the first separator is disposed on the conveyance unit side, and further electrically connected to the pressure roll when the first separator is disposed on the pressure roll side; and an insulation inspection unit that is connected to the first terminal and the second terminal and that applies a voltage to the laminated electrode to inspect insulation condition of the laminated electrode.

Optional combinations of the aforementioned constituting elements, and implementation of the present disclosure in the form of methods, apparatuses, or systems may also be practiced as additional modes of the present disclosure.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which:

FIG. 4 is a diagram that shows relationships between the number of pressure rolls and a rotation angle of a conveyance unit in insulation inspection;

DETAILED DESCRIPTION OF THE INVENTION

Figure 1:
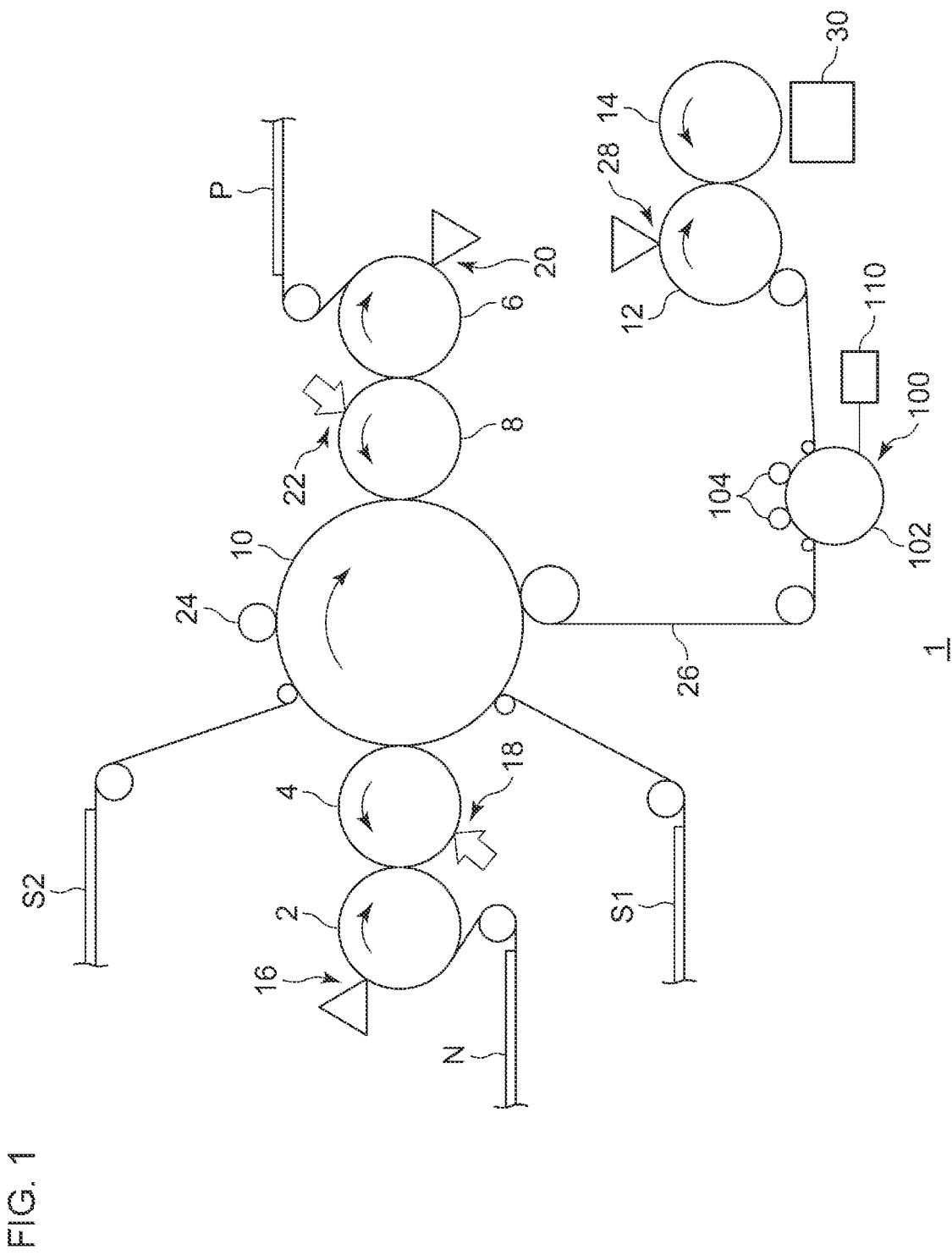
FIG. 1 is a schematic diagram of laminated electrode group manufacturing equipment that includes an insulation inspection device according to a first embodiment.

In the following, the present disclosure will be described based on preferred embodiments with reference to the drawings. The embodiments are intended to be illustrative only and not to limit the present disclosure, so that it should be understood that not all of the features or combinations thereof described in the embodiments are necessarily essential to the present disclosure. Like reference characters denote like or corresponding constituting elements, members, and processes in each drawing, and repetitive description will be omitted as appropriate.

Also, the scale or shape of each component shown in each drawing is defined for the sake of convenience to facilitate the explanation and is not to be regarded as limitative unless otherwise specified. When the terms "first", "second", and the like are used in the present specification or claims, such terms do not imply any order or degree of importance and are used to distinguish one configuration from another, unless otherwise specified. Also, in each drawing, part of members less important in describing embodiments may be omitted.

First Embodiment

FIG. 1 is a schematic diagram of laminated electrode group manufacturing equipment that includes an insulation inspection device according to the first embodiment. As an example, laminated electrode group manufacturing equipment 1 is continuous drum-type manufacturing equipment in which multiple drums are combined. Performing each process of cutting, heating, bonding, laminating, and the like of electrode bodies and separators on the drums enables high-speed and continuous manufacturing of laminated electrodes and laminated electrode groups. The laminated electrode groups may be used, for example, for lithium-ion secondary batteries.

The laminated electrode group manufacturing equipment 1 includes a first electrode cutting drum 2, a first electrode heating drum 4, a second electrode cutting drum 6, a second electrode heating drum 8, a bonding drum 10, an insulation inspection device 100, a separator cutting drum 12, and a laminating drum 14.

The first electrode cutting drum 2 is a drum for cutting a continuous body of multiple first electrode plates into multiple individual first electrode plates and conveying the plates. In the present embodiment, the first electrode is a negative electrode. To the first electrode cutting drum 2, a strip-shaped first electrode continuous body N as the continuous body of multiple first electrode plates is supplied. The first electrode continuous body N includes a first electrode current collector and a first electrode active material layer. The first electrode active material layer is laminated on both surfaces or one surface of the first electrode current collector.

Each of the first electrode current collector and the first electrode active material layer can be made of a publicly-known material and has a publicly-known structure. The first electrode current collector may be constituted by foil or a porous body made of copper, aluminum, or the like, for example. The first electrode active material layer may be formed by applying, onto a surface of the first electrode current collector, first electrode mixture slurry that contains a first electrode active material, such as graphite, and also contains a binder, a dispersant, and the like, and by drying and rolling the applied film. The thickness of the first electrode current collector may be in the range from 3 μm to 50 μm inclusive, for example. Also, the thickness of the first electrode active material layer may be in the range from 10 μm to 100 μm inclusive, for example.

The first electrode cutting drum 2 includes multiple holding heads arranged in a circumferential direction of the drum, and a cutting blade that cuts the first electrode continuous body N into multiple individual first electrode plates. Each of the multiple holding heads includes a holding surface that adsorbs and holds the first electrode continuous body N. The holding surface of each holding head faces outward from the first electrode cutting drum 2. The first electrode continuous body N supplied to the first electrode cutting drum 2 is conveyed by the rotation of the first electrode cutting drum 2 while being adsorbed and held by the holding surfaces of the multiple holding heads.

Each of the multiple holding heads rotates around the central axis of the first electrode cutting drum 2 and can also move in a circumferential direction of the drum independently of other holding heads. Such independent driving of the holding heads enables adjustment of the positions of cutting by the cutting blade in the first electrode continuous body N and also enables adjustment of the positions of the individually divided first electrode plates, for example. The first electrode cutting drum 2 adsorbs and holds the supplied first electrode continuous body N and rotates to convey the first electrode continuous body N. At a cutting position 16 schematically illustrated in FIG. 1, the first electrode cutting drum 2 cuts the first electrode continuous body N to produce the first electrode plates. The first electrode continuous body N is cut by the cutting blade at a position between adjacent holding heads, so that multiple individual first electrode plates are obtained. Each first electrode plate thus obtained is conveyed while being adsorbed and held by each holding head. The positions of the multiple produced first electrode plates are monitored using a camera or the like.

The first electrode heating drum 4 is disposed in close proximity to the first electrode cutting drum 2. Before the proximity position between the first electrode cutting drum 2 and the first electrode heating drum 4, the speed of a holding head of the first electrode cutting drum 2 is temporarily increased or decreased until it becomes substantially identical with the linear velocity of the first electrode heating drum 4. As a result, the relative speed of the holding head with respect to the first electrode heating drum 4 becomes substantially zero. At the timing when the relative speed becomes substantially zero, the holding head discharges, to the first electrode heating drum 4 side, the first electrode plate that the holding head has been adsorbing and holding.

The first electrode heating drum 4 rotates while adsorbing and holding the first electrode plates discharged from the first electrode cutting drum 2 and preheats the first electrode plates with a built-in heater. The preheating is performed to thermally bond a first electrode plate and a separator in the subsequent bonding process. Although the first electrode plates are heated at a heating position 18 in the present embodiment, the position is not limited thereto. For example, the first electrode plates may be heated in the entire circumferential area of the first electrode heating drum 4.

The second electrode cutting drum 6 is a drum for cutting a continuous body of multiple second electrode plates into multiple individual second electrode plates and conveying the plates. In the present embodiment, the second electrode is a positive electrode. To the second electrode cutting drum 6, a strip-shaped second electrode continuous body P as the continuous body of multiple second electrode plates is supplied. The second electrode continuous body P includes a second electrode current collector and a second electrode active material layer. The second electrode active material layer is laminated on both surfaces or one surface of the second electrode current collector.

Each of the second electrode current collector and the second electrode active material layer can be made of a publicly-known material and has a publicly-known structure. The second electrode current collector may be constituted by foil or a porous body made of stainless steel, aluminum, or the like, for example. The second electrode active material layer may be formed by applying, onto a surface of the second electrode current collector, second electrode mixture slurry that contains a second electrode active material, such as lithium cobalt oxide or lithium iron phosphate, and also contains a binder, a dispersant, and the like, and by drying and rolling the applied film. The thickness of the second electrode current collector may be in the range from 3 μm to 50 μm inclusive, for example. Also, the thickness of the second electrode active material layer may be in the range from 10 μm to 100 μm inclusive, for example.

The second electrode cutting drum 6 includes multiple holding heads arranged in a circumferential direction of the drum, and a cutting blade that cuts the second electrode continuous body P into multiple individual second electrode plates. Each of the multiple holding heads includes a holding surface that adsorbs and holds the second electrode continuous body P. The holding surface of each holding head faces outward from the second electrode cutting drum 6. The second electrode continuous body P supplied to the second electrode cutting drum 6 is conveyed by the rotation of the second electrode cutting drum 6 while being adsorbed and held by the holding surfaces of the multiple holding heads.

Each of the multiple holding heads rotates around the central axis of the second electrode cutting drum 6 and can also move in a circumferential direction of the drum independently of other holding heads. Such independent driving of the holding heads enables adjustment of the positions of cutting by the cutting blade in the second electrode continuous body P and also enables adjustment of the positions of the individually divided second electrode plates, for example. The second electrode cutting drum 6 adsorbs and holds the supplied second electrode continuous body P and rotates to convey the second electrode continuous body P. At a cutting position 20 schematically illustrated in FIG. 1, the second electrode cutting drum 6 cuts the second electrode continuous body P to produce the second electrode plates. The second electrode continuous body P is cut by the cutting blade at a position between adjacent holding heads, so that multiple individual second electrode plates are obtained. Each second electrode plate thus obtained is conveyed while being adsorbed and held by each holding head. The positions of the multiple produced second electrode plates are monitored using a camera or the like.

The second electrode heating drum 8 is disposed in close proximity to the second electrode cutting drum 6. Before the proximity position between the second electrode cutting drum 6 and the second electrode heating drum 8, the speed of a holding head of the second electrode cutting drum 6 is temporarily increased or decreased until it becomes substantially identical with the linear velocity of the second electrode heating drum 8. As a result, the relative speed of the holding head with respect to the second electrode heating drum 8 becomes substantially zero. At the timing when the relative speed becomes substantially zero, the holding head discharges, to the second electrode heating drum 8 side, the second electrode plate that the holding head has been adsorbing and holding.

The second electrode heating drum 8 rotates while adsorbing and holding the second electrode plates discharged from the second electrode cutting drum 6 and preheats the second electrode plates with a built-in heater. The preheating is performed to thermally bond a second electrode plate and a separator in the subsequent bonding process. Although the second electrode plates are heated at a heating position 22 in the present embodiment, the position is not limited thereto. For example, the second electrode plates may be heated in the entire circumferential area of the second electrode heating drum 8.

The bonding drum 10 is a drum for forming a laminated electrode continuous body in which laminated electrodes, which each are constituted by a first separator, a first electrode plate, a second separator, and a second electrode plate, are continuously arranged. The bonding drum 10 is disposed in close proximity to the first electrode heating drum 4 and the second electrode heating drum 8. To the bonding drum 10, a strip-shaped first separator continuous body S1, in which multiple first separators are continuously arranged, and a strip-shaped second separator continuous body S2, in which multiple second separators are continuously arranged, are supplied. On a surface of each of the first separator continuous body S1 and the second separator continuous body S2, a thermal bonding layer is provided. The thermal bonding layer has a property of developing no adhesiveness at room temperature but developing adhesiveness when heated.

Also, to the bonding drum 10, multiple first electrode plates are supplied from the first electrode cutting drum 2 via the first electrode heating drum 4, and multiple second electrode plates are supplied from the second electrode cutting drum 6 via the second electrode heating drum 8. Each first electrode plate is rotationally conveyed while being preheated on the first electrode heating drum 4 and is discharged, to the bonding drum 10 side, at the proximity position between the first electrode heating drum 4 and the bonding drum 10. Each second electrode plate is rotationally conveyed while being preheated on the second electrode heating drum 8 and is discharged, to the bonding drum 10 side, at the proximity position between the second electrode heating drum 8 and the bonding drum 10.

The first separator continuous body S1, each first electrode plate, the second separator continuous body S2, and each second electrode plate are supplied to the bonding drum 10 at positions provided in the enumerated order from the upstream side of the rotational direction of the bonding drum 10. Accordingly, the first separator continuous body S1 is supplied to the bonding drum 10 first at a certain position. The first separator continuous body S1 is adsorbed and held by the bonding drum 10 and rotationally conveyed. Subsequently, at a position on the downstream side of the supply position of the first separator continuous body S1, the first electrode plates are supplied from the first electrode heating drum 4 to the bonding drum 10 and placed on the first separator continuous body S1. The multiple first electrode plates are arranged on the first separator continuous body S1 at predetermined intervals in the conveying direction of the first separator continuous body S1.

Subsequently, at a position on the downstream side of the supply position of the first electrode plates, the second separator continuous body S2 is supplied to the bonding drum 10 and placed over the multiple first electrode plates. Thereafter, the first separator continuous body S1, multiple first electrode plates, and second separator continuous body S2 are pressurized by a thermocompression bonding roller 24, at a position on the downstream side of the supply position of the second separator continuous body S2. Accordingly, the first separator continuous body S1, each first electrode plate, and the second separator continuous body S2 are bonded together. Subsequently, at a position on the downstream side of the position of pressure bonding by the thermocompression bonding roller 24, the second electrode plates are supplied from the second electrode heating drum 8 to the bonding drum 10 and placed on the second separator continuous body S2. The multiple second electrode plates are arranged on the second separator continuous body S2 at predetermined intervals in the conveying direction of the second separator continuous body S2. Also, the multiple second electrode plates are bonded to the second separator continuous body S2 by the pressing force of the second electrode heating drum 8.

Through the process described above, the first separator continuous body S1, multiple first electrode plates, second separator continuous body S2, and multiple second electrode plates are laminated in this order and bonded to each other, forming a laminated electrode continuous body 26. The laminated electrode continuous body 26 has a structure in which the laminated electrodes, which each are constituted by a first separator, a first electrode plate, a second separator, and a second electrode plate, are continuously connected by the first separator continuous body S1 and the second separator continuous body S2. By halting the supply of the second electrode plates from the second electrode cutting drum 6 side, three-layered laminated electrodes without the second electrode plates may be produced after every fixed number of pieces. The electrode plates of which supply is halted may also be the first electrode plates.

The laminated electrode continuous body 26 is conveyed from the bonding drum 10 to the insulation inspection device 100. In the insulation inspection device 100, the insulation condition of each laminated electrode is inspected. The structure of the insulation inspection device 100 will be detailed later. The laminated electrode continuous body 26 that has passed through the insulation inspection device 100 is conveyed to the separator cutting drum 12.

The separator cutting drum 12 is a drum for cutting the first separator continuous body S1 and the second separator continuous body S2 in the laminated electrode continuous body 26 to obtain multiple individual laminated electrodes. The separator cutting drum 12 includes multiple holding heads arranged in a circumferential direction of the drum, and a cutting blade that cuts the laminated electrode continuous body 26 into multiple individual laminated electrodes. Each of the multiple holding heads includes a holding surface that adsorbs and holds the laminated electrode continuous body 26. The holding surface of each holding head faces outward from the separator cutting drum 12. The laminated electrode continuous body 26 supplied to the separator cutting drum 12 is conveyed by the rotation of the separator cutting drum 12 while being adsorbed and held by the holding surfaces of the multiple holding heads.

Each of the multiple holding heads rotates around the central axis of the separator cutting drum 12 and may also be movable in a circumferential direction of the drum independently of other holding heads. Such independent driving of the holding heads enables adjustment of the positions of cutting by the cutting blade in the laminated electrode continuous body 26 and also enables adjustment of the positions of the individually divided laminated electrodes, for example.

The separator cutting drum 12 adsorbs and holds the supplied laminated electrode continuous body 26 and rotates to convey the laminated electrode continuous body 26. At a cutting position 28 schematically illustrated in FIG. 1, the separator cutting drum 12 cuts the laminated electrode continuous body 26. The laminated electrode continuous body 26 is cut by the cutting blade at a position between adjacent holding heads, so that multiple individual laminated electrodes are obtained. At the time, in the laminated electrode continuous body 26, the first separator continuous body S1 and the second separator continuous body S2 are cut at a position between electrode plates that are adjacent in the conveying direction of the laminated electrode continuous body 26. Each laminated electrode thus obtained is conveyed while being adsorbed and held by each holding head. A holding head discharges, to the laminating drum 14 side, a laminated electrode that the holding head has been adsorbing and holding. The positions of the multiple produced laminated electrodes are monitored using a camera or the like.

The laminating drum 14 is a drum for laminating multiple laminated electrodes on a lamination stage 30 to form a laminated electrode group. The laminating drum 14 includes multiple laminating heads arranged in a circumferential direction of the drum. Each laminating head includes a holding surface that adsorbs and holds a laminated electrode. The holding surface of each laminating head faces outward from the laminating drum 14. Each of the multiple laminating heads rotates around the central axis of the laminating drum 14 and can also move in a circumferential direction of the drum independently of other laminating heads. With such independent driving of the laminating heads, while the rotation of the laminating drum 14 can be maintained at a constant angular velocity, each laminating head can be placed in a stop state at a laminating position facing the lamination stage 30. By placing a laminating head in the stop state at a position facing the lamination stage 30, the laminated electrode adsorbed and held by the laminating head can be discharged onto the lamination stage 30 with high positional accuracy.

The lamination stage 30 is disposed immediately beneath the laminating drum 14. On the lamination stage 30, the laminated electrodes discharged from the laminating drum 14 are sequentially laminated. Thus, a laminated electrode group is formed. The lamination stage 30 can be driven in an X-axis direction and a Y-axis direction perpendicular to each other. Also, a tilt angle on an X-Y plane of the lamination stage 30 can be adjusted. This enables adjustment of the positions in the X-axis direction and the Y-axis direction and the tilt angle of a laminated electrode discharged from the laminating drum 14, with respect to a laminated electrode already laminated on the lamination stage 30.

Figure 2:
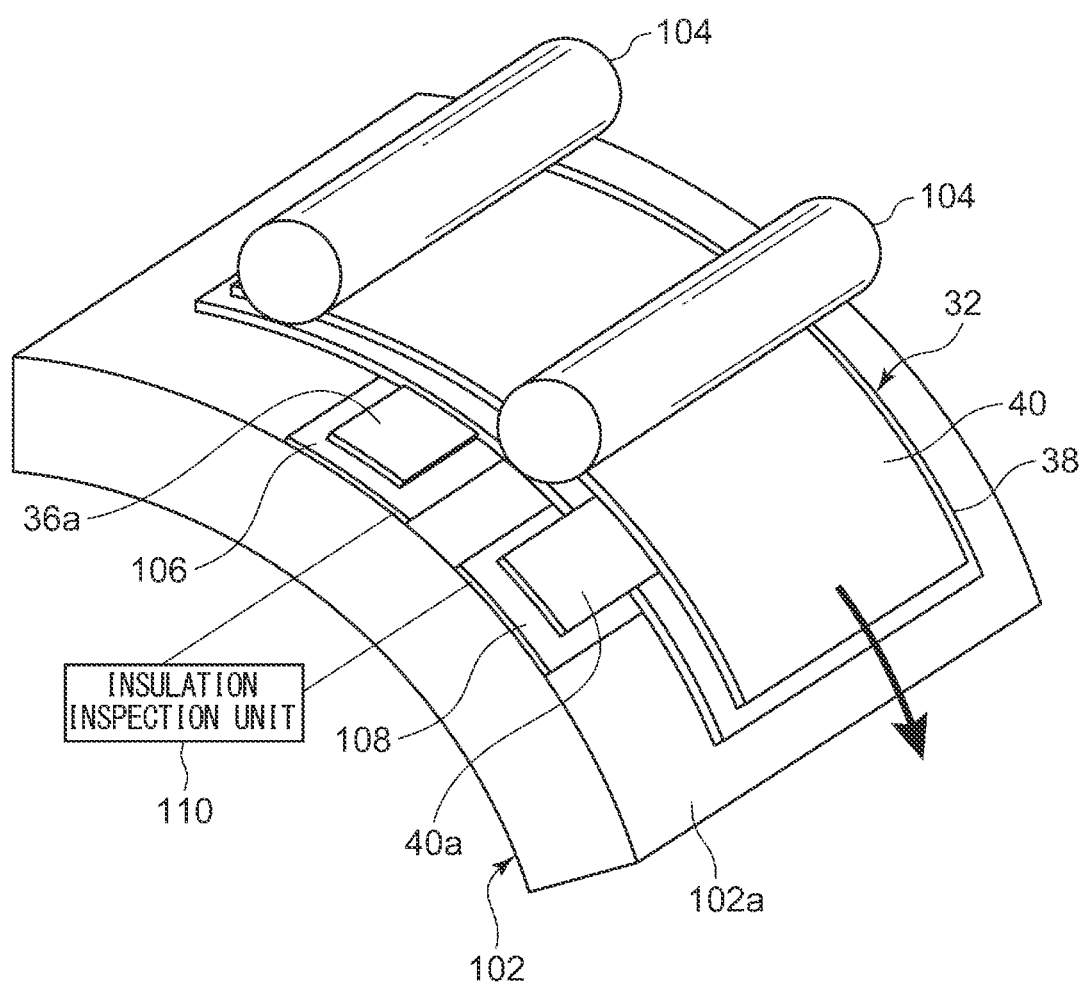
FIG. 2 is a perspective view of part of the insulation inspection device.
Figure 3:
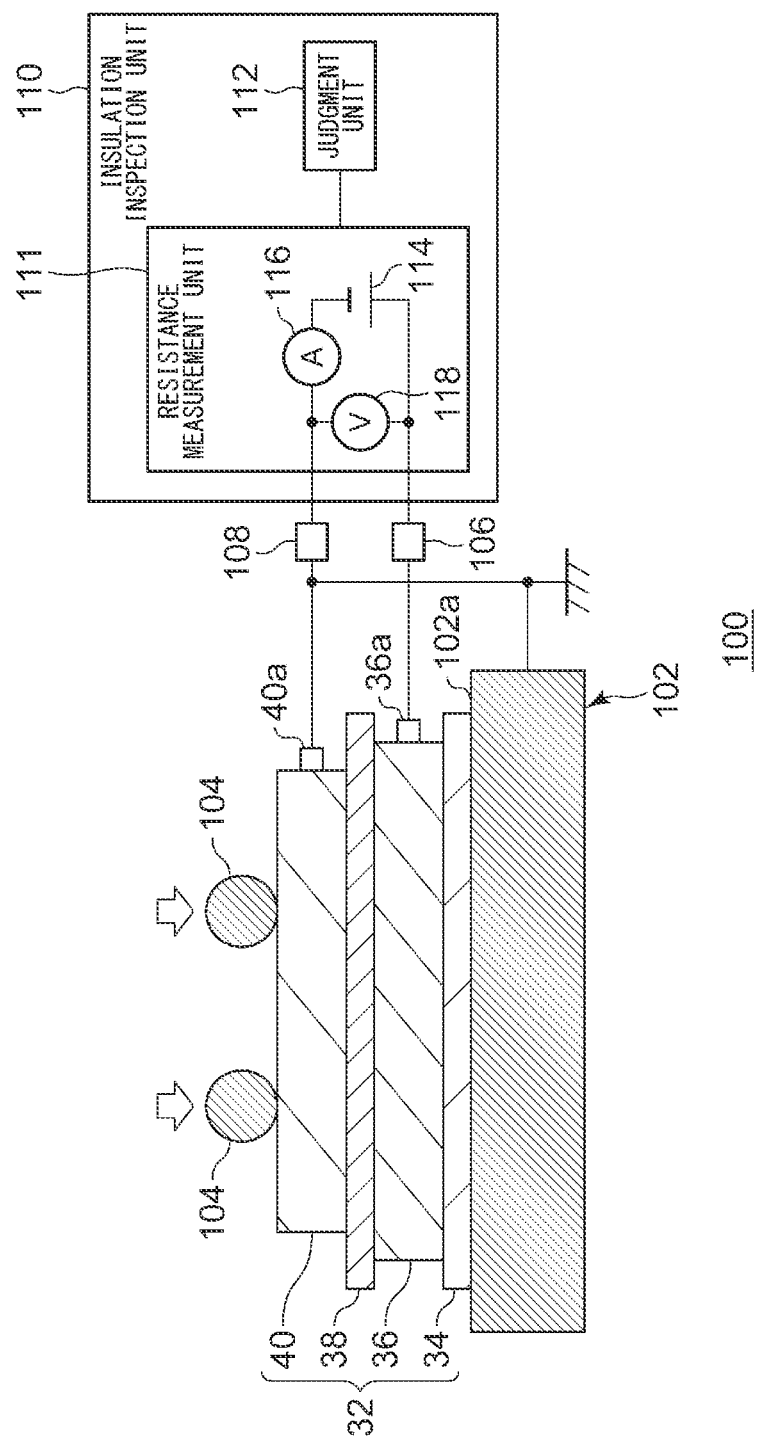
FIG. 3 is a sectional view of part of the insulation inspection device.

In the following, the insulation inspection device 100 will be described in detail. FIG. 2 is a perspective view of part of the insulation inspection device 100. FIG. 3 is a sectional view of part of the insulation inspection device 100. In FIG. 2, illustration of the circuit structure of an insulation inspection unit is omitted. Also, in FIG. 3, a conveyance unit 102 is schematically illustrated. Further, in FIGS. 2 and 3, a single laminated electrode 32 is illustrated for the convenience of illustration.

The insulation inspection device 100 includes a conveyance unit 102, a pressure roll 104, a first terminal 106, a second terminal 108, and an insulation inspection unit 110. The conveyance unit 102 is a mechanism for conveying the laminated electrodes 32. In the present embodiment, the conveyance unit 102 is constituted by a conveyance roll. The conveyance unit 102 includes a holding surface 102a that holds a laminated electrode 32. The holding surface 102a is provided over the entire circumference of the conveyance roll. Each laminated electrode 32 has a structure in which a first separator 34, a first electrode plate 36, a second separator 38, and a second electrode plate 40 are laminated in this order. In the present embodiment, a laminated electrode 32 is placed on the holding surface 102a such that the first separator 34 faces the conveyance unit 102 side. Therefore, the first separator 34 and the holding surface 102a are in contact with each other.

The pressure roll 104 is a mechanism for pressing a laminated electrode 32 against the conveyance unit 102. The pressure roll 104 is disposed to face the holding surface 102a with a certain space in between and rotates as the laminated electrode 32 is conveyed. The laminated electrode 32 is conveyed by the conveyance unit 102 and passes through the gap between the conveyance unit 102 and the pressure roll 104. The laminated electrode 32 is pressed against the holding surface 102a by the pressure roll 104 sequentially from the upstream side in the conveyance direction. The pressure roll 104 comes into contact with the second electrode plate 40. The linear pressure of the pressure roll 104 is about 2 N/cm, for example.

The first terminal 106 is electrically connected to the first electrode plate 36. The first electrode plate 36 includes a tab part 36a for current collection protruding from one side of the electrode plate extending in the conveyance direction of the laminated electrodes 32. The tab part 36a protrudes from a partial area of the one side. When viewed from the laminating direction of the separators and the electrode plates, the tab part 36a protrudes to the outside of the first separator 34 and the second separator 38. The first terminal 106 comes into contact with the tab part 36a to be electrically connected to the first electrode plate 36.

The second terminal 108 is electrically connected to the second electrode plate 40. The second electrode plate 40 includes a tab part 40a for current collection protruding from one side of the electrode plate extending in the conveyance direction of the laminated electrodes 32. The tab part 40a protrudes from a partial area of the one side. Also, the tab part 40a is disposed on the same side as the tab part 36a. When viewed from the laminating direction of the separators and the electrode plates, the tab part 40a protrudes to the outside of the first separator 34 and the second separator 38. The second terminal 108 comes into contact with the tab part 40a to be electrically connected to the second electrode plate 40.

The first terminal 106 and the second terminal 108 of the present embodiment are provided on the holding surface 102a. On the holding surface 102a, multiple terminal pairs, which each are constituted by one first terminal 106 and one second terminal 108, are arranged at predetermined intervals in the conveyance direction of the laminated electrodes 32. The interval between adjacent terminal pairs corresponds to the interval between adjacent two laminated electrodes 32 in the laminated electrode continuous body 26. Also, the interval between the first terminal 106 and the second terminal 108 in each pair corresponds to the interval between the tab part 36a and the tab part 40a in each laminated electrode 32.

Accordingly, when the laminated electrode continuous body 26 is held by the holding surface 102a, the tab part 36a of each laminated electrode 32 can be brought into contact with the first terminal 106, and the tab part 40a thereof can be brought into contact with the second terminal 108. Therefore, by simply placing the laminated electrode continuous body 26 on the holding surface 102a, both the electrical connection between the first electrode plate 36 and the first terminal 106 and the electrical connection between the second electrode plate 40 and the second terminal 108 can be accomplished.

Each of the first terminal 106 and the second terminal 108 has a planar shape. Since each laminated electrode 32 is oriented such that the first separator 34 comes into contact with the holding surface 102a, the tab part 40a is located farther from the holding surface 102a than the tab part 36a. Accordingly, the thickness of the second terminal 108 is set greater than the thickness of the first terminal 106. Therefore, when a laminated electrode 32 is placed on the holding surface 102a, the first terminal 106 and the second terminal 108 can be respectively brought into contact with the tab part 36a and the tab part 40a more certainly.

The first terminal 106 is electrically insulated from the conveyance unit 102. Meanwhile, the second terminal 108 is electrically connected to the conveyance unit 102. In the conveyance unit 102, at least holding surface 102a is made of a conductive material such as metal. The first terminal 106 is fixed to the holding surface 102a via an insulating sheet or insulating adhesive, which is not illustrated. Therefore, the first terminal 106 is electrically insulated from the conveyance unit 102. Meanwhile, the second terminal 108 is fixed to the holding surface 102a directly or via a conductive adhesive or the like. Therefore, the second terminal 108 is electrically connected to the conveyance unit 102.

Accordingly, the tab part 36a is electrically insulated from the conveyance unit 102. Meanwhile, the tab part 40a is electrically connected to the conveyance unit 102 via the second terminal 108. Also, the first terminal 106 is not connected to the second electrode plate 40, and the second terminal 108 is not connected to the first electrode plate 36. Therefore, if there is no insulation defect in the laminated electrode 32, the first terminal 106 is electrically insulated from the second electrode plate 40, and the second terminal 108 is electrically insulated from the first electrode plate 36.

The insulation inspection unit 110 inspects the insulation condition of each laminated electrode 32. As an example, the insulation inspection unit 110 includes a resistance measurement unit 111 and a judgment unit 112. The resistance measurement unit 111 may be constituted by a publicly-known insulation resistance tester, for example, and includes a power supply 114, an ammeter 116, and a voltmeter 118. The power supply 114 is connected to the first terminal 106 and the second terminal 108 to apply a voltage to a laminated electrode 32. The ammeter 116 is inserted in series in the wire that connects the power supply 114 and the second terminal 108. The voltmeter 118 is connected to the wire that connects the power supply 114 and the first terminal 106 and also to the wire that connects the power supply 114 and the second terminal 108.

The resistance measurement unit 111 applies a voltage from the power supply 114 to a laminated electrode 32 to measure, with the ammeter 116, a leakage current generated in the laminated electrode 32 and also measure, with the voltmeter 118, the voltage at the time. The resistance measurement unit 111 calculates the insulation resistance value of the laminated electrode 32 by dividing the measured voltage by the measured current. The resistance measurement unit 111 then transmits a signal indicating the insulation resistance value thus obtained to the judgment unit 112.

The judgment unit 112 judges the insulation condition of the laminated electrode 32 based on the measurement results from the resistance measurement unit 111. The judgment unit 112 may be implemented by an element such as a CPU or memory of a computer or by a circuit as a hardware configuration, and by a computer program or the like as a software configuration. FIG. 3 illustrates a functional block implemented by cooperation of such components. It will be naturally understood by those skilled in the art that the functional block may be implemented in a variety of forms by combinations of hardware and software.

For example, the judgment unit 112 may retain a threshold of the insulation resistance value in advance and judge, when the insulation resistance value of a laminated electrode 32 falls below the threshold, that the laminated electrode 32 has an insulation defect. Also, the judgment unit 112 may acquire the voltage value and the current value from the resistance measurement unit 111 to calculate the insulation resistance value of the laminated electrode 32. Further, the insulation inspection unit 110 may measure the current value while the voltage applied to the laminated electrode 32 is kept constant; based on the change in the current value, the insulation inspection unit 110 may judge an insulation defect of the laminated electrode 32.

When the first separator 34 has a through hole or the like or when there is conductive foreign matter that conducts electricity between the first electrode plate 36 and the holding surface 102a, a closed circuit including the power supply 114, the first terminal 106, the first electrode plate 36, the conveyance unit 102, and the second terminal 108 is formed, so that a current flows therein. Also, when the second separator 38 has a through hole or the like or when there is conductive foreign matter that conducts electricity between the first electrode plate 36 and the second electrode plate 40, a closed circuit including the power supply 114, the first terminal 106, the first electrode plate 36, the second electrode plate 40, and the second terminal 108 is formed, so that a current flows therein.

Therefore, according to the present embodiment, even when only one of the first separator 34 or the second separator 38 has an insulation defect or when foreign matter mixed in the first electrode plate 36 or the second electrode plate 40 is not large enough to penetrate the two separators, an insulation defect in the laminated electrode 32 can be detected.

The insulation inspection unit 110 can inspect the insulation condition of a region of a laminated electrode 32 pressed by the pressure roll 104. When a laminated electrode 32 is pressed by the pressure roll 104, the thicknesses of the first separator 34 and the second separator 38 decrease, and the distance between the holding surface 102a and the first electrode plate 36 and the distance between the first electrode plate 36 and the second electrode plate 40 become smaller. Accordingly, when a short circuit occurs between the holding surface 102a and the first electrode plate 36 or between the first electrode plate 36 and the second electrode plate 40 at the position pressed by the pressure roll 104 and a closed circuit is formed, an insulation defect is detected. The laminated electrode 32 is pressed by the pressure roll 104 sequentially from the upstream side toward the downstream side in the conveyance direction while being conveyed by the conveyance unit 102 and, when the laminated electrode 32 has passed through the gap between the conveyance unit 102 and the pressure roll 104, the insulation inspection of the entire laminated electrode 32 is completed.

The insulation inspection device 100 is preferably equipped with multiple pressure rolls 104 arranged in the conveyance direction of the laminated electrodes 32. The insulation inspection device 100 of the present embodiment includes two pressure rolls 104. The insulation inspection of a laminated electrode 32 is performed during a period from when the front end of the laminated electrode 32 reaches the most downstream pressure roll 104 in the conveyance direction of the laminated electrode 32 until the rear end of the laminated electrode 32 reaches the most upstream pressure roll 104. Accordingly, with multiple pressure rolls 104 provided, an area of the laminated electrode 32 pressurized by each pressure roll 104 during the insulation inspection can be made smaller. In other words, the area pressed by the pressure rolls 104 at one time in the laminated electrode 32 can be increased. This can reduce the rotation angle of the conveyance unit 102 required for the insulation inspection. Therefore, the time required for the insulation inspection can be shortened.

FIG. 4 is a diagram that shows relationships between the number of pressure rolls 104 and the rotation angle of the conveyance unit 102 in insulation inspection. The insulation resistance value of each laminated electrode 32 cannot be measured unless the laminated electrode 32 is charged. Accordingly, the conduction of current from the power supply 114 to a laminated electrode 32 needs to be started before the laminated electrode 32 is pressurized by the most downstream pressure roll 104. Therefore, the insulation inspection is started when the current conduction to the laminated electrode 32 is started.

The start timing of insulation inspection is determined based on the positional relationship between the laminated electrode 32 and each pressure roll 104, which is calculated from the conveying speed of the laminated electrode 32 and the time required to charge the laminated electrode 32. The conveying speed of the laminated electrode 32 may be 65 m/min, for example, and the time required to charge the laminated electrode 32 may be about 10 ms, for example. As shown in FIG. 4, when the 12 o'clock position of the conveyance roll is defined as the reference (0 degrees) and when one pressure roll 104 is provided at the 0-degree position, the start timing of the insulation inspection is when the front end of the laminated electrode 32 is located at the −4-degree position. Also, when two pressure rolls 104 are provided at the ±17-degree positions, the start timing is when the front end of the laminated electrode 32 is located at the 12-degree position. Also, when three pressure rolls 104 are provided at the 0-degree position and the ±26-degree positions, the start timing is when the front end of the laminated electrode 32 is located at the 22-degree position.

At the same time as the charging of the laminated electrode 32 is completed, the front end of the laminated electrode 32 reaches the pressure roll 104 on the most downstream side, and the pressurization to the laminated electrode 32 by the pressure roll 104 starts. From this point until the rear end of the laminated electrode 32 reaches the most upstream pressure roll 104, the resistance value of the laminated electrode 32 is measured (during inspection). When the rear end of the laminated electrode 32 reaches the most upstream pressure roll 104, pressurization to the entire area of the laminated electrode 32, i.e., the measurement of the resistance value, is completed. At the timing, the current conduction to the laminated electrode 32 is also stopped.

If the voltage remains in the laminated electrode 32, sparks due to a short circuit may occur on the downstream side of the insulation inspection device 100, for example. Accordingly, it is preferable that the conveyance unit 102 holds the laminated electrode 32 until the discharge of the laminated electrode 32 is completed. Therefore, the insulation inspection of the laminated electrode 32 is terminated when the discharge of the laminated electrode 32 is completed. The time required from the stop of current conduction to the completion of discharge is about 10 ms, for example.

As shown in FIG. 4, when one pressure roll 104 is provided, the end timing of the insulation inspection is when the front end of the laminated electrode 32 is located at the 90-degree position. Also, when two pressure rolls 104 are provided, the end timing is when the front end of the laminated electrode 32 is located at the 74-degree position. Also, when three pressure rolls 104 are provided, the end timing is when the front end of the laminated electrode 32 is located at the 63-degree position. Therefore, when one pressure roll 104 is provided, the rotation angle required for the insulation inspection is 94 degrees; when two pressure rolls 104 are provided, the required rotation angle is 62 degrees; and when three pressure rolls 104 are provided, the required rotation angle is 41 degrees.

From the above results, it is understood that, by providing multiple pressure rolls 104, the time required for the insulation inspection can be shortened. The arrangement of each pressure roll 104 on the conveyance unit 102 is not limited to that shown in FIG. 4. Also, four or more pressure rolls 104 may be provided. However, as the number of pressure rolls 104 increases, the disadvantages of increased cost due to the increased number of pressure rolls 104 and the like become likely to outweigh the advantages of reduced inspection time and the like. Therefore, the number of pressure rolls 104 may preferably be three or fewer.

As described above, the insulation inspection device 100 according to the present embodiment includes: the conveyance unit 102 that conveys a laminated electrode 32 in which the first separator 34, the first electrode plate 36, the second separator 38, and the second electrode plate 40 are laminated in this order, in which the first separator 34 is disposed on the conveyance unit 102 side; the pressure roll 104 that presses the laminated electrode 32 against the conveyance unit 102; the first terminal 106 electrically connected to the first electrode plate 36; the second terminal 108 electrically connected to the second electrode plate 40 and the conveyance unit 102; and the insulation inspection unit 110 that is connected to the first terminal 106 and the second terminal 108 and that applies a voltage to the laminated electrode 32 to inspect insulation condition of the laminated electrode 32.

Accordingly, even when only one of the first separator 34 or the first electrode plate 36 has an insulation defect, insulation defects in the laminated electrode 32 can be detected. Also, compared to the case where the insulation condition of the laminated electrode 32 is inspected with a pair of electrodes sandwiching the laminated electrode 32 from both outsides, an insulation defect caused by smaller foreign matter can be detected. Therefore, the performance of insulation inspection for the laminated electrodes 32 can be improved.

Also, the insulation inspection device 100 of the present embodiment enables in-line insulation inspection. Accordingly, it can be prevented that the production lead time of the laminated electrode groups is increased by the insulation inspection of the laminated electrodes 32. Also, the insulation inspection device 100 of the present embodiment includes multiple pressure rolls 104 arranged in the conveyance direction of the laminated electrodes 32. This can reduce the time required for the insulation inspection of the laminated electrodes 32. Therefore, it can be prevented that the conveying speed of the laminated electrodes 32 is decreased because the insulation inspection device 100 is provided on the conveyance line.

Also, the conveyance unit 102 includes the holding surface 102a that holds a laminated electrode 32, and the first terminal 106 and the second terminal 108 are provided on the holding surface 102a. Accordingly, at the same time as a laminated electrode 32 is placed on the holding surface 102a, each electrode plate and a corresponding terminal can be electrically connected. Also, each terminal follows the movement of the laminated electrode 32. Therefore, the electrical connection between each electrode plate and a corresponding terminal can be maintained with a simpler structure.

Second Embodiment

Figure 5:
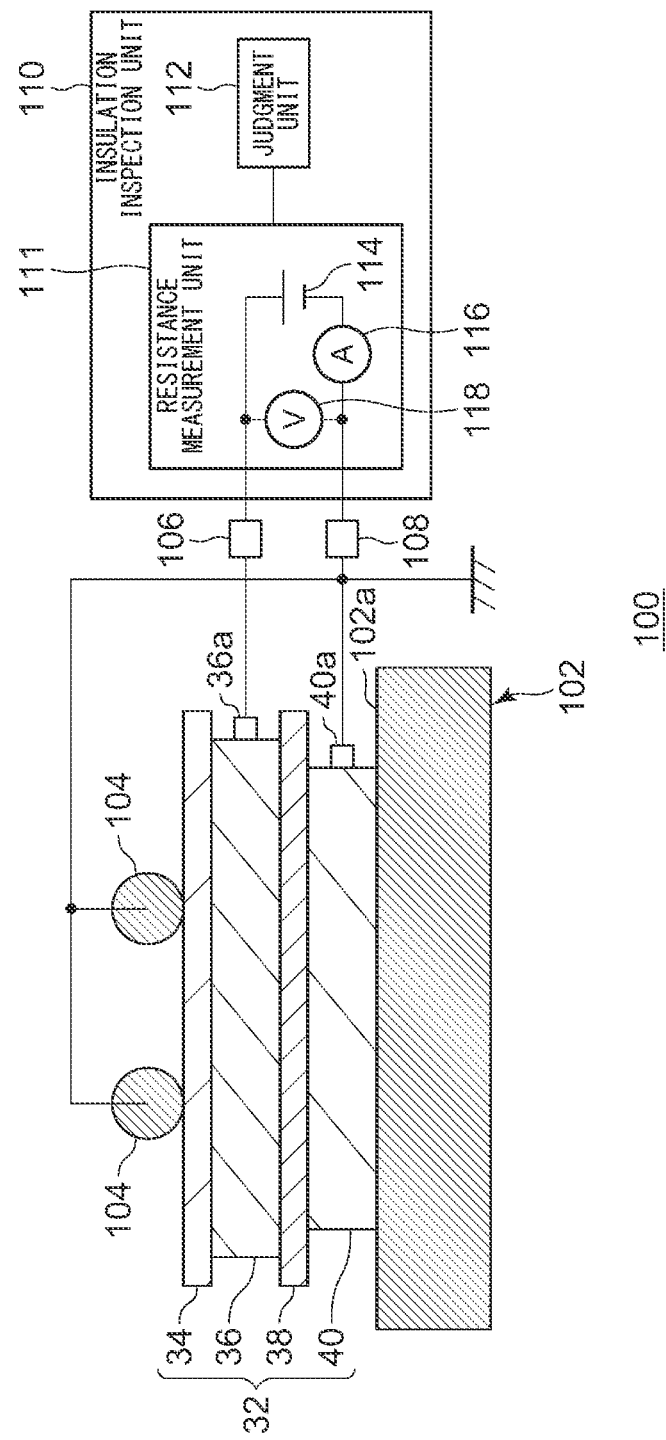
FIG. 5 is a sectional view of part of the insulation inspection device according to a second embodiment.

The second embodiment includes configurations in common with the first embodiment, except for the orientation of the laminated electrode 32 placed on the conveyance unit 102 and the structure of the insulation inspection device 100. In the following, the present embodiment will be described mainly for configurations different from those in the first embodiment, and description of configurations in common will be briefly given or may be omitted. FIG. 5 is a sectional view of part of the insulation inspection device 100 according to the second embodiment. In FIG. 5, the conveyance unit 102 is schematically illustrated. Also, for the convenience of illustration, a single laminated electrode 32 is illustrated.

The insulation inspection device 100 includes the conveyance unit 102, the pressure roll 104, the first terminal 106, the second terminal 108, and the insulation inspection unit 110. The conveyance unit 102 includes the holding surface 102a. In the present embodiment, a laminated electrode 32 is placed on the holding surface 102a such that the second electrode plate 40 faces the conveyance unit 102 side. The pressure roll 104 presses the laminated electrode 32 against the conveyance unit 102. The pressure roll 104 comes into contact with the first separator 34 and presses the laminated electrode 32 against the holding surface 102a. Thus, the laminated electrode 32 is conveyed in a state where the first separator 34 is disposed on the pressure roll 104 side. The pressure roll 104 is constituted by an electric conductor such as metal.

The first terminal 106 is electrically connected to the first electrode plate 36. The first terminal 106 comes into contact with the tab part 36a to be electrically connected to the first electrode plate 36. The second terminal 108 is electrically connected to the second electrode plate 40. The second terminal 108 comes into contact with the tab part 40a to be electrically connected to the second electrode plate 40. Also, the first terminal 106 is electrically insulated from the pressure roll 104. Meanwhile, the second terminal 108 is electrically connected to the pressure roll 104.

For example, the first terminal 106 is fixed to the holding surface 102a via an insulating sheet or insulating adhesive, not illustrated, and connected to the tab part 36a. Also, the second terminal 108 is divided into multiple portions, and some of the portions are fixed to the holding surface 102a via an insulating sheet or insulating adhesive, not illustrated, and connected to the tab part 40a. Some other portions are electrically connected to the pressure roll 104. Accordingly, the tab part 36a and the tab part 40a are electrically insulated from the conveyance unit 102. Also, the first terminal 106 is not connected to the second electrode plate 40, and the second terminal 108 is not connected to the first electrode plate 36.

As an example, the insulation inspection unit 110 includes the resistance measurement unit 111 and the judgment unit 112. The resistance measurement unit 111 includes the power supply 114, the ammeter 116, and the voltmeter 118. The resistance measurement unit 111 applies a voltage from the power supply 114 to a laminated electrode 32 to measure the insulation resistance value of the laminated electrode 32 and transmits a signal indicating the measurement result to the judgment unit 112. The judgment unit 112 judges that the laminated electrode 32 has an insulation defect.

When the first separator 34 has a through hole or the like or when there is foreign matter that conducts electricity between the first electrode plate 36 and the pressure roll 104, a closed circuit including the power supply 114, the first terminal 106, the first electrode plate 36, the pressure roll 104, and the second terminal 108 is formed, so that a current flows therein. Also, when the second separator 38 has a through hole or the like or when there is foreign matter that conducts electricity between the first electrode plate 36 and the second electrode plate 40, a closed circuit including the power supply 114, the first terminal 106, the first electrode plate 36, the second electrode plate 40, and the second terminal 108 is formed, so that a current flows therein.

Thus, also according to the present embodiment, even when only one of the first separator 34 or the second separator 38 has an insulation defect or when foreign matter mixed in the first electrode plate 36 or the second electrode plate 40 is not large enough to penetrate the two separators, an insulation defect in the laminated electrode 32 can be detected, as is the case in the first embodiment. Therefore, the performance of insulation inspection for the laminated electrodes 32 can be improved.

Third Embodiment

Figure 6:
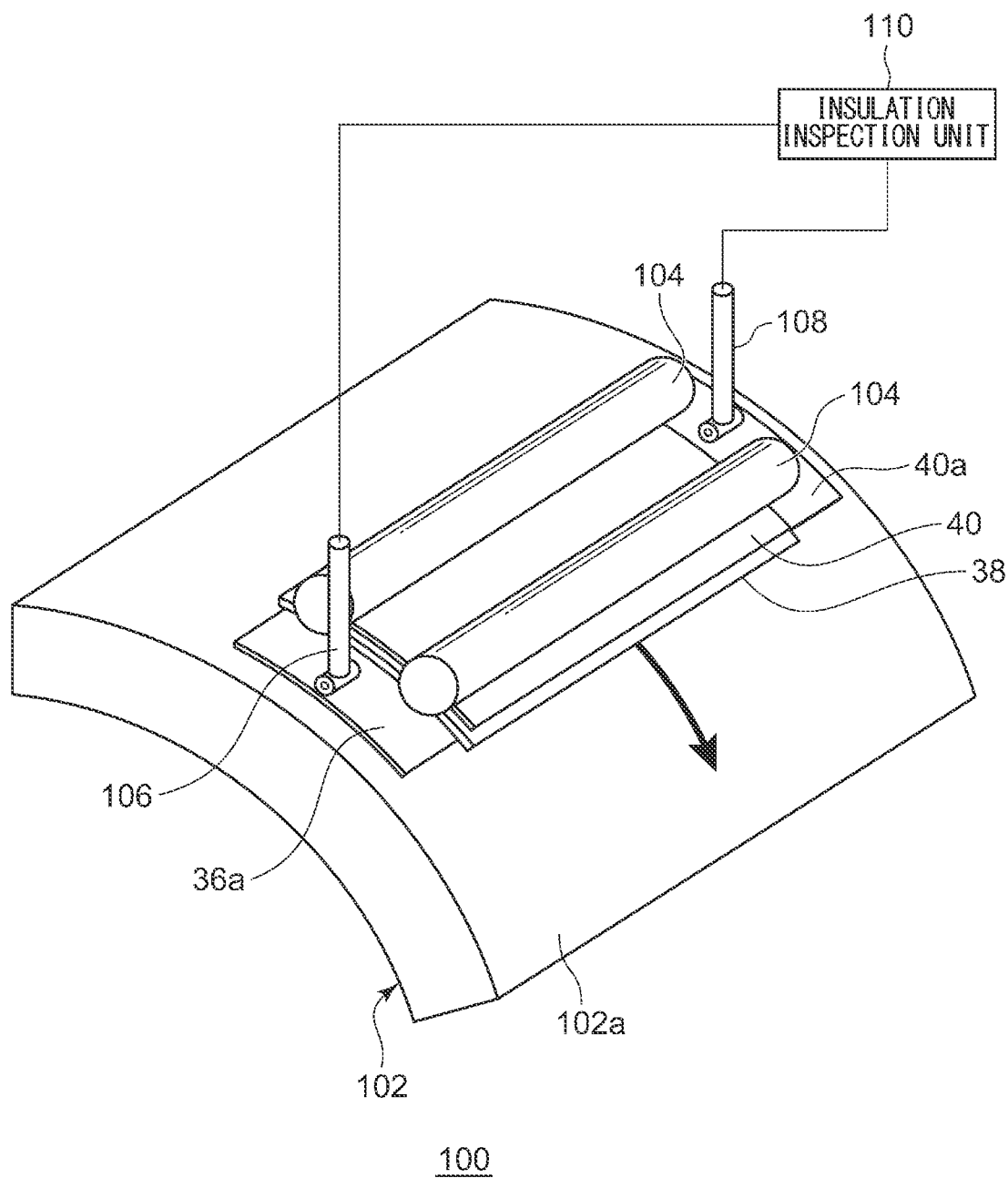
FIG. 6 is a perspective view of part of the insulation inspection device according to a third embodiment.

The third embodiment includes configurations in common with the first embodiment, except for the structures of the laminated electrodes 32 and the insulation inspection device 100. In the following, the present embodiment will be described mainly for configurations different from those in the first embodiment, and description of configurations in common will be briefly given or may be omitted. FIG. 6 is a perspective view of part of the insulation inspection device 100 according to the third embodiment. In FIG. 6, illustration of the circuit structure of the insulation inspection unit 110 is omitted. Also, for the convenience of illustration, a single laminated electrode 32 is illustrated.

Each laminated electrode 32 of the present embodiment has a structure in which the first separator 34, the first electrode plate 36, the second separator 38, and the second electrode plate 40 are laminated in this order. The first electrode plate 36 includes the tab part 36a protruding from one side of the electrode plate extending in the conveyance direction of the laminated electrodes 32. The tab part 36a in the present embodiment protrudes from the entire area of the one side. The second electrode plate 40 includes the tab part 40a protruding from one side of the electrode plate extending in the conveyance direction of the laminated electrodes 32. The tab part 40a protrudes from the entire area of the one side. Also, the tab part 40a is disposed on the opposite side from the tab part 36a.

The insulation inspection device 100 includes the conveyance unit 102, the pressure roll 104, the first terminal 106, the second terminal 108, and the insulation inspection unit 110. The conveyance unit 102 includes the holding surface 102a. A laminated electrode 32 is placed on the holding surface 102a such that the first separator 34 faces the conveyance unit 102 side. The pressure roll 104 presses the laminated electrode 32 against the conveyance unit 102. The pressure roll 104 comes into contact with the second electrode plate 40 and presses the laminated electrode 32 against the holding surface 102a.

The first terminal 106 of the present embodiment is constituted by a probe with a roll at the tip. The roll of the first terminal 106 comes into contact with the tab part 36a. The roll rotates as the laminated electrode 32 is conveyed, so as to maintain the electrical connection with the tab part 36a. Since an insulation member intervenes between the tab part 36a and the holding surface 102a, the tab part 36a is electrically insulated from the holding surface 102a.

The second terminal 108 of the present embodiment is constituted by a probe with a roll at the tip. The roll of the second terminal 108 comes into contact with the tab part 40a. The roll rotates as the laminated electrode 32 is conveyed, so as to maintain the electrical connection with the tab part 40a. Also, the tab part 40a is pressed against the holding surface 102a by the second terminal 108, so as to be electrically connected to the conveyance unit 102. Accordingly, the second terminal 108 is electrically connected to the holding surface 102a via the tab part 40a. The second terminal 108 may also be electrically connected to the holding surface 102a without the intervention of the tab part 40a. The first terminal 106 is not connected to the second electrode plate 40, and the second terminal 108 is not connected to the first electrode plate 36.

Thus, the configuration set forth above also provides the same effects as the first embodiment. Also in the present embodiment, the laminated electrode 32 may be placed on the holding surface 102a such that the second electrode plate 40 faces the conveyance unit 102 side, as is the case in the second embodiment.

Fourth Embodiment

Figure 7:
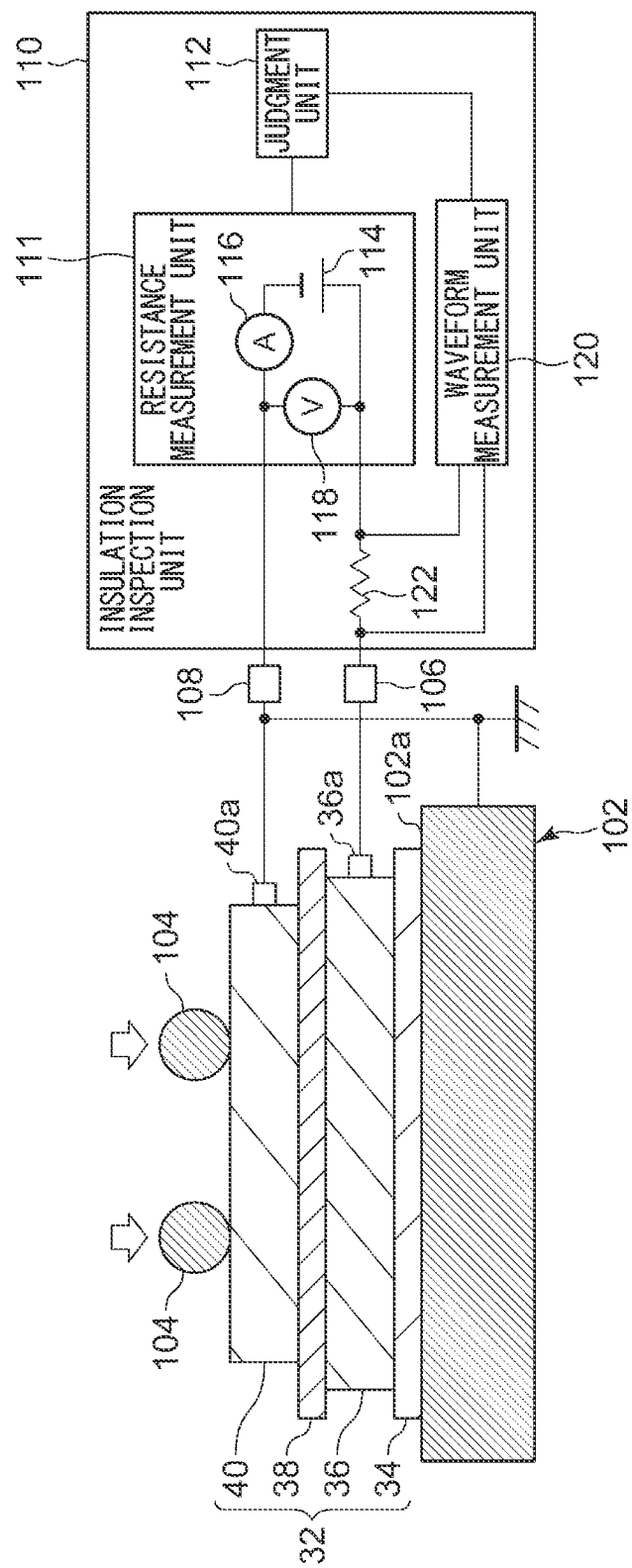
FIG. 7 is a sectional view of part of the insulation inspection device according to a fourth embodiment.

The fourth embodiment includes configurations in common with the first embodiment, except for the structure of the insulation inspection device 100. In the following, the present embodiment will be described mainly for configurations different from those in the first embodiment, and description of configurations in common will be briefly given or may be omitted. FIG. 7 is a sectional view of part of the insulation inspection device 100 according to the fourth embodiment. In FIG. 7, the conveyance unit 102 is schematically illustrated. Also, for the convenience of illustration, a single laminated electrode 32 is illustrated.

The insulation inspection device 100 includes the conveyance unit 102, the pressure roll 104, the first terminal 106, the second terminal 108, and the insulation inspection unit 110. The conveyance unit 102 includes the holding surface 102a. A laminated electrode 32 is placed on the holding surface 102a such that the first separator 34 faces the conveyance unit 102 side. The pressure roll 104 presses the laminated electrode 32 against the conveyance unit 102. The pressure roll 104 comes into contact with the second electrode plate 40 and presses the laminated electrode 32 against the holding surface 102a.

The first terminal 106 comes into contact with the tab part 36a to be electrically connected to the first electrode plate 36. The second terminal 108 comes into contact with the tab part 40a to be electrically connected to the second electrode plate 40. Also, the first terminal 106 is electrically insulated from the conveyance unit 102. Meanwhile, the second terminal 108 is electrically connected to the conveyance unit 102. Also, the first terminal 106 is not connected to the second electrode plate 40, and the second terminal 108 is not connected to the first electrode plate 36.

The insulation inspection unit 110 includes the resistance measurement unit 111, the judgment unit 112, and a waveform measurement unit 120. The resistance measurement unit 111 includes the power supply 114, the ammeter 116, and the voltmeter 118. The resistance measurement unit 111 applies a voltage from the power supply 114 to a laminated electrode 32 to measure the insulation resistance value of the laminated electrode 32. The resistance measurement unit 111 then transmits a signal indicating the measurement result to the judgment unit 112.

The waveform measurement unit 120 measures the waveform of a current or voltage generated when a voltage is applied to the laminated electrode 32. The waveform measurement unit 120 is constituted by a publicly-known pulse meter, for example. The insulation inspection unit 110 includes a resistor 122 inserted in series in the wire that connects the power supply 114 and the first terminal 106, and the waveform measurement unit 120 is connected in parallel to the resistor 122. With the waveform measurement unit 120, spike-like waveforms of a current or a voltage or both generated when the laminated electrode 32 is pressurized by the pressure roll 104 can be detected. Such a spike-like waveform is generated when conductive foreign matter is pressed by the pressure roll 104, for example. The waveform measurement unit 120 then transmits a signal indicating the measurement result to the judgment unit 112.

The judgment unit 112 judges the insulation condition of the laminated electrode 32 based on the measurement results from the resistance measurement unit 111 and the waveform measurement unit 120. For example, when the insulation resistance value of the laminated electrode 32 falls below a threshold or when a waveform is measured by the waveform measurement unit 120, the judgment unit 112 judges that the laminated electrode 32 has an insulation defect. When insulation inspection is performed by pressing a laminated electrode 32 with the pressure roll 104, only a portion pressed by the pressure roll 104 is assumed to be locally short-circuited. In this case, the measured insulation resistance value corresponds to an average of the resistance value of the portion pressed by the pressure roll 104 and the resistance value of the portion that is not pressed. Accordingly, if the decrease in the resistance value of the portion pressed by the pressure roll 104 is small, it may not be judged as an insulation defect. In contrast, by detecting, with the waveform measurement unit 120, a leakage waveform of a current or a voltage generated when the pressure roll 104 passes, even a slight decrease in the resistance value caused by foreign matter of small diameter or the like can be judged as an insulation defect in the laminated electrode 32.

Therefore, according to the present embodiment, the performance of insulation inspection for the laminated electrodes 32 can be further improved. The judgment unit 112 may judge an insulation defect in a laminated electrode 32 only based on the measurement result from the waveform measurement unit 120. Also in the present embodiment, the laminated electrode 32 may be placed on the holding surface 102a such that the second electrode plate 40 faces the conveyance unit 102 side, as is the case in the second embodiment.

Embodiments of the present disclosure have been described in detail. The abovementioned embodiments merely describe specific examples for carrying out the present disclosure. The embodiments are not intended to limit the technical scope of the present disclosure, and various design modifications, including changes, addition, and deletion of constituting elements, may be made to the embodiments without departing from the scope of ideas of the present disclosure defined in the claims. Such an additional embodiment with a design modification added has the effect of each of the combined embodiments and modifications. In the aforementioned embodiments, matters to which design modifications may be made are emphasized with the expression of "of the present embodiment", "in the present embodiment", or the like. However, design modifications may also be made to matters without such expression. Optional combinations of the abovementioned constituting elements may also be employed as additional modes of the present disclosure. Also, the hatching provided on the cross sections in the drawings does not limit the materials of the objects with the hatching.

The insulation inspection device 100 can also inspect insulation of the laminated electrodes 32 in the form of a laminated electrode continuous body 26 and can also inspect insulation of the laminated electrodes 32 separated individually. Therefore, the insulation inspection device 100 may also be disposed between the separator cutting drum 12 and the laminating drum 14.

The laminated electrode group manufacturing equipment 1 need not necessarily be a continuous drum type. Also, the insulation inspection device 100 is not limited to a roll type. The conveyance unit 102 may be a planar conveyance stage, instead of a conveyance roll. Also, the insulation inspection unit 110 may include only the resistance measurement unit 111 or the waveform measurement unit 120 or both, and a user may directly monitor the measurement results. Also, the judgment unit 112 may be provided in an external device, such as an external computer.

The invention claimed is:

1. An insulation inspection device, comprising:
a conveyance unit that conveys a laminated electrode in which a first separator, a first electrode plate, a second separator, and a second electrode plate are laminated in this order;
a pressure roll that presses the laminated electrode against the conveyance unit;
a first terminal electrically connected to the first electrode plate;
a second terminal electrically connected to the second electrode plate, the second terminal being further electrically connected to the conveyance unit when the first separator is disposed on the conveyance unit side and being further electrically connected to the pressure roll when the first separator is disposed on the pressure roll side; and
an insulation inspection unit that is connected to the first terminal and the second terminal and that applies a voltage to the laminated electrode to inspect insulation condition of the laminated electrode.

2. The insulation inspection device according to claim 1, comprising a plurality of the pressure rolls arranged in a conveyance direction of the laminated electrode.

3. The insulation inspection device according to claim 1, wherein
the conveyance unit includes a holding surface that holds the laminated electrode, and
the first terminal and the second terminal are provided on the holding surface.

4. The insulation inspection device according to claim 1, wherein the insulation inspection unit comprises a resistance measurement unit that measures an insulation resistance value of the laminated electrode based on a current or a voltage generated when a voltage is applied to the laminated electrode.

5. The insulation inspection device according to claim 1, wherein the insulation inspection unit comprises a waveform measurement unit that measures a waveform of a current or a voltage generated when a voltage is applied to the laminated electrode.

* * * * *